(12) United States Patent
Shin

(10) Patent No.: US 7,020,819 B2
(45) Date of Patent: Mar. 28, 2006

(54) SEMICONDUCTOR INTEGRATED CIRCUIT WITH LOCAL MONITOR CIRCUITS

(75) Inventor: Young-Min Shin, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 428 days.

(21) Appl. No.: 10/008,076

(22) Filed: Nov. 8, 2001

(65) Prior Publication Data

US 2002/0129310 A1    Sep. 12, 2002

(30) Foreign Application Priority Data

Mar. 12, 2001 (KR) .............................. 2001-12604

(51) Int. Cl.
*G01R 31/28* (2006.01)
(52) U.S. Cl. .................................................. 714/727
(58) Field of Classification Search ................ 714/727, 714/724, 726, 729, 733, 700; 324/765; 327/144; 326/16
See application file for complete search history.

(56) References Cited

U.S. PATENT DOCUMENTS

| | | | |
|---|---|---|---|
| 5,281,864 A | 1/1994 | Hahn et al. | 307/272.2 |
| 5,717,701 A | 2/1998 | Angelotti et al. | 371/22.3 |
| 6,032,279 A | 2/2000 | Ramamurthy et al. | 714/727 |
| 6,052,811 A * | 4/2000 | Ahsuri | 714/745 |
| 6,075,389 A * | 6/2000 | Umemoto et al. | 327/49 |
| 6,229,368 B1 * | 5/2001 | Lee | 327/292 |
| 6,477,115 B1 * | 11/2002 | Inoshita et al. | 368/120 |

* cited by examiner

*Primary Examiner*—Guy Lamarre
*Assistant Examiner*—James C. Kerveros
(74) *Attorney, Agent, or Firm*—Mills & Onello, LLP

(57) ABSTRACT

A semiconductor integrated circuit includes a boundary scan register and a plurality of local monitor circuits. The local monitor circuits are arranged individually about peripheral circuit regions of a semiconductor integrated circuit, being spaced from the boundary scan register, in order to measure and predict operation speeds in accordance with local on-chip process variations at a plurality of locations on the peripheral circuit regions. The operational speed of the semiconductor integrated circuit is determined by taking correlations into account between an overall signal delay time measured by the boundary scan register and local signal delay times measured by the respective local monitor circuits.

24 Claims, 12 Drawing Sheets

<Vertical Type>

<Horizontal Type>

SEMICONDUCTOR INTEGRATED CIRCUIT WITH LOCAL MONITOR CIRCUITS

RELATED APPLICATION

This application relies for priority upon Korean Patent Application No. 2001-12604, filed on Mar. 12, 2001, the contents of which are herein incorporated by reference in their entirety.

1. Field of the Invention

The present invention relates to a semiconductor integrated circuit, and more specifically to a circuit to evaluate the operation speed of the semiconductor integrated circuit.

2. Background of the Invention

It is common for large-scale integrated circuits to accompany test operations for evaluating performance of their circuit components. A typical test operation is to determine the speed capability of output buffers, i.e., "boundary scan test". In general, a boundary scan register circuit, as defined by IEEE Standard Test Access Port and Boundary-Scan Architecture (IEEE std 1149.1-1190 and IEEE 1149.1 std 1149.1a-1993), is used for integrated circuits in which CMOS output buffers are employed. As well known, it is possible to test the current states of connections in semiconductor integrated circuits by inserting test patterns into the boundary scan registers interconnected to each other at the boundary of the circuit.

FIG. 1 shows an arrangement on a semiconductor integrated circuit embedding a boundary scan register constructed of boundary scan cells. The semiconductor integrated circuit 10 includes a core circuit 11, a plurality of input/output pins 12~30, and a plurality of boundary scan cells 31~46. The core circuit 11 is activated during normal operation of the semiconductor integrated circuit. During a normal mode of operation, the core circuit 11 is connected to the input/output pins 12~30. The boundary scan cells are activated only during test mode. The boundary scan cells 31~46 form a boundary scan register 47 of a boundary scan test circuit. It should be understood that a bypass register, a command register, and a TAP (Test Access Port) controller etc which are not shown in the FIGS., shall further be provided for the boundary scan test circuit. The boundary scan cells 31~46 each have the same circuit construction well known in the art, each including a multiplexer MUX, flip-flops F/F, and inverters, which is by way of example shown in FIG. 2.

Various applications for the boundary scan test circuits have been proposed, as disclosed, for example, in U.S. Pat. No. 5,281,864 entitled "IMPLEMENTATION OF THE IEEE 1149.1 BOUNDARY-SCAN ARCHITECTURE", U.S. Pat. No. 5,717,701 entitled "APPARATUS AND METHOD FOR TESTING INTERCONNECTIONS BETWEEN SEMICONDUCTOR DEVICES", and U.S. Pat. No. 6,032,279 entitled "BOUNDARY SCAN SYSTEM WITH ADDRESS DEPENDENT INSTRUCTIONS".

Practical utility of working dies relies primarily on operation speed, rather than completion of a normal operation, because product cost for packaging semiconductor integrated circuits (for example, a central processing unit CPU) is expensive. For this reasons, it is necessary to introduce an evaluation procedure to determine whether a semiconductor integrated circuit is being driven at a desired (or predetermined) operation speed at a wafer-level test.

In general, an inverter chain is employed in the boundary scan cell (e.g., a portion denoted by the dotted line shown in FIG. 2) in order to measure and predict the operation speeds of a semiconductor integrated circuit or a central processing unit at a wafer-level test. The inverter chain forming a signal path for transferring a control signal from the TAP controller is serially connected between input/output pins (e.g., between the input/output pins 15 and 16), corresponding to the boundary scan cell that is serially connected between the input/output pins (i.e., the input/output pins 15 and 16). A turn-around time (hereinafter, referred to as $t_{BSR}$), that is, the time for turning around peripheral circuits of a semiconductor integrated circuit, is measured through the inverter chain forming the signal path, and is then used as data for predicting operation speed of the semiconductor integrated circuit. For example, as shown in FIG. 3A, operation speed of the semiconductor integrated circuit is determined in accordance with the measured turn-around $t_{BSR}$. That is to say, it is possible to obtain predictable values of operation speeds for the semiconductor integrated circuit by calculating tracking plots on the basis of the measured turn-around time $t_{BSR}$.

However according to this speed measuring method, it is difficult to accurately predict an operation speed based solely on the turn-around time $t_{BSR}$ under the circumstances of more minute and complex process conditions and more serious OCV (on-chip variation), because process variation is directly reflected by the evaluation for operation speed through the inverter. As shown in FIG. 3B, for example, if the OCV becomes more severe, a distribution profile of $t_{BSR}$ vs. the operation speed enlarges in accordance with fluctuating OCV. In this case, the resulting predicable operation speed profile of the semiconductor integrated circuit with a shorter $t_{BSR}$ and a more severe OCV may be lower than that of semiconductor integrated circuit with a longer $t_{BSR}$ and a less severe OCV. Therefore, it is more and more difficult to predict an operation speed of the semiconductor integrated circuit in view of a more severe OCV and a more complex manufacturing process.

As an alternative solution to mitigate this problem, an operator can measure an operation speed manually at plural locations in the integrated circuit using test equipment after completing a manufacturing process and then predict an operation speed dependent on factors of the OCV by rendering the obtained values about the operation speeds to be stacked in a database. However, such a manual evaluation for the operation speed handles only a sampling of few wafers in a lot. Furthermore, the values measured by an operator are not enough to represent all wafers in the condition of a more minute manufacturing process, which again results in a broader distribution profile (as shown in FIG. 3B).

SUMMARY OF THE INVENTION

It is therefore an object of the present invention to provide a semiconductor integrated circuit capable of evaluating the influence of on-chip process variations on the operation speed thereof.

It is another object of the invention to provide a semiconductor integrated circuit capable of obtaining accurate values for operation speeds regardless of on-chip variations.

In order to attain the above objects, according to an aspect of the invention there is provided a semiconductor integrated circuit having a plurality of input/output pins, including means for providing a first signal path successively formed along a peripheral circuit region of the semiconductor integrated circuit to measure an overall signal delay time corresponding to overall on-chip process variations, and means for providing second signal paths individually formed in local circuit regions on the peripheral circuit regions of the semiconductor integrated circuit to measure local signal delay times corresponding to localized on-chip process variations.

The means for providing the first signal path includes a boundary scan register providing a signal path successively formed along the peripheral circuit region of the semiconductor integrated circuit. The means for providing the second signal paths includes local monitor circuits for measuring local operation speeds involved in local on-chip process variations at a plurality of locations on the semiconductor integrated circuit, being arranged individually in the peripheral circuit region of a semiconductor integrated circuit and being spaced from the boundary scan register. The local monitor circuits include dummy or input/output pads and a speed correlation circuit connected between the pads. The speed correlation circuit includes circuit elements that are operable in correlation with a speed and serially connected between the pads.

The device according to the present invention has an advantage of measuring and predicting an operation speed of a semiconductor integrated circuit, by distinguishing between local on-chip process variations at a plurality of locations on the semiconductor integrated circuit.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The description of the preferred embodiment of the present invention will be now described in detail with reference to the appended drawings.

The semiconductor integrated circuit of the present invention includes a boundary scan register and a plurality of local monitor circuits. The local monitor circuits are individually arranged in peripheral circuits in a semiconductor integrated circuit, and are apart from the boundary scan register, in order to measure and predict operation speeds of the semiconductor integrated circuit in accordance with local on-chip process variations at plural locations over the semiconductor integrated circuit. Each local monitor circuit is connected between dummy pads, between a dummy pad and an input/output pad, or between input/output pads, including circuit elements cooperative with operation speeds. Operation speed of the semiconductor integrated circuit is determined regarding the correlation between an overall signal delay time measured by the boundary scan register and local signal delay times measured by the respective local monitor circuits. The boundary scan register provides a signal delay time which reflects overall on-chip process variations in peripheral circuits of the semiconductor integrated circuit, whereas each local monitor circuit provides a signal delay time which reflects on-chip process variations at each independent location. With these procedures for measuring, an operation speed of a semiconductor integrated circuit can be measured and predicted by storing the obtained values involved in the signal delay into a database. As a result, it is possible to minimize the often-times erroneous prediction that occurs when the operation speed is measured by using solely the boundary scan registers, as described above.

Figure 1:
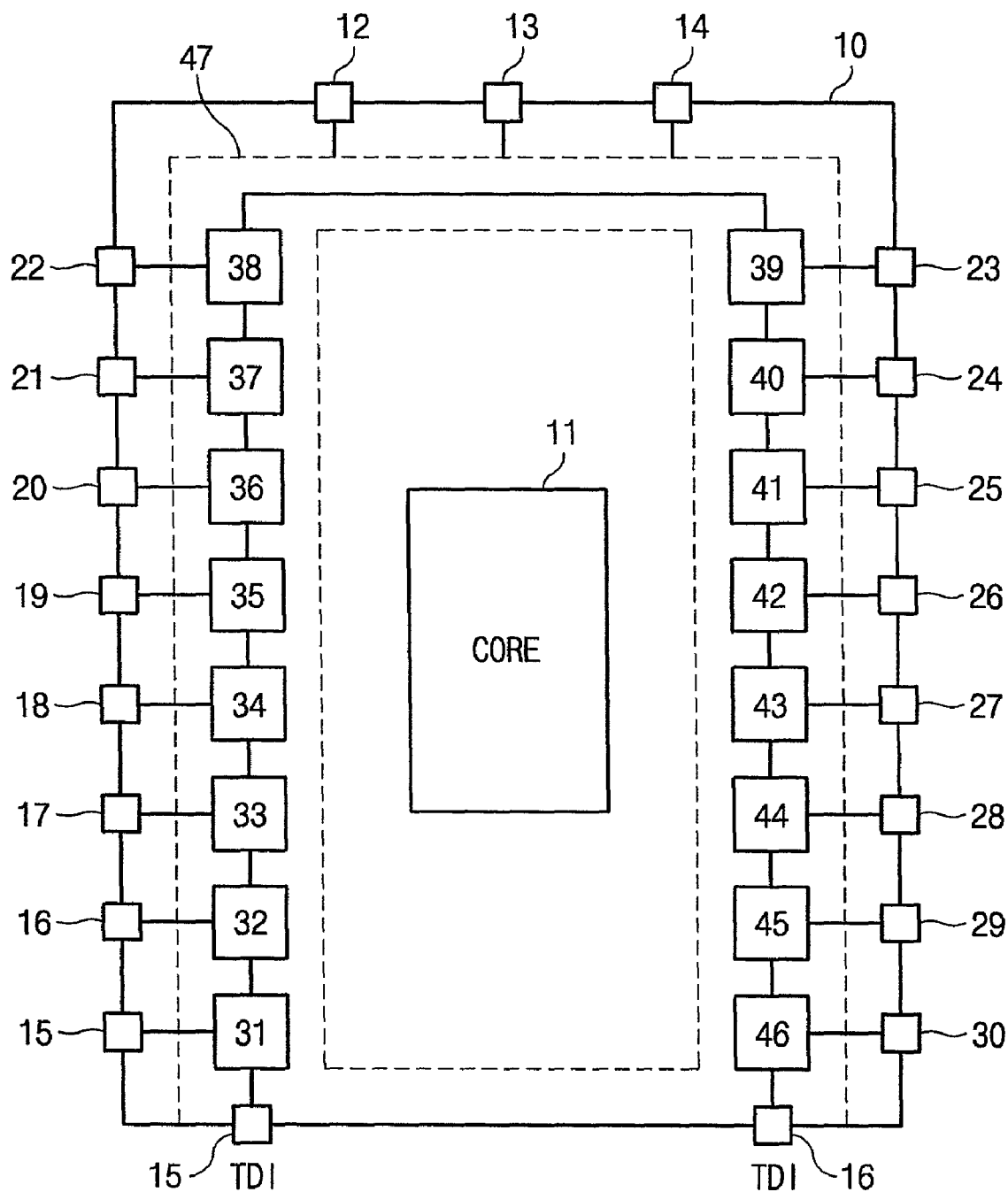
FIG. 1 is a block diagram illustrating a general arrangement of a semiconductor integrated circuit having boundary scan cells constructing a boundary scan register.
Figure 2:
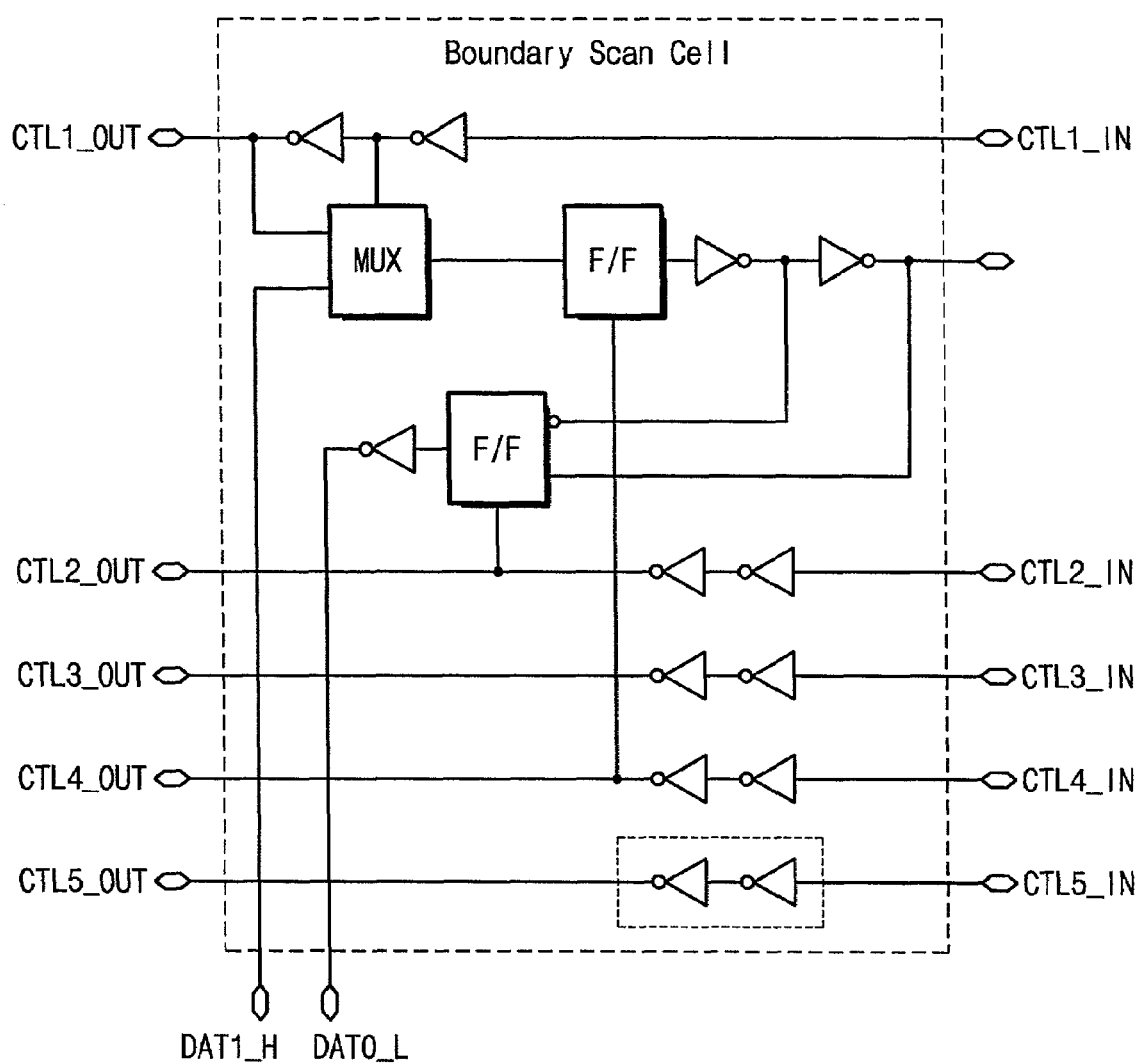
FIG. 2 is an exemplary circuit diagram of a boundary scan cell shown in FIG. 1.
Figure 3A:
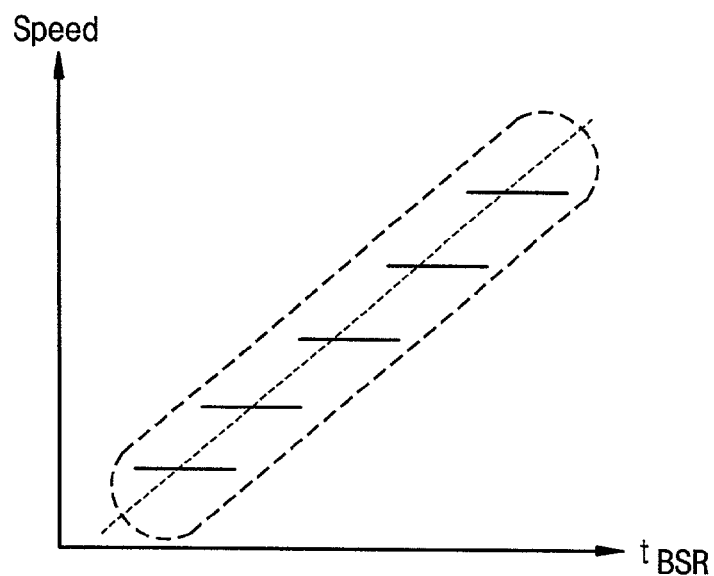
FIGS. 3A and 3B are graphic diagrams illustrating correlations of operational speeds to signal delay times of the boundary scan register.
Figure 3B:
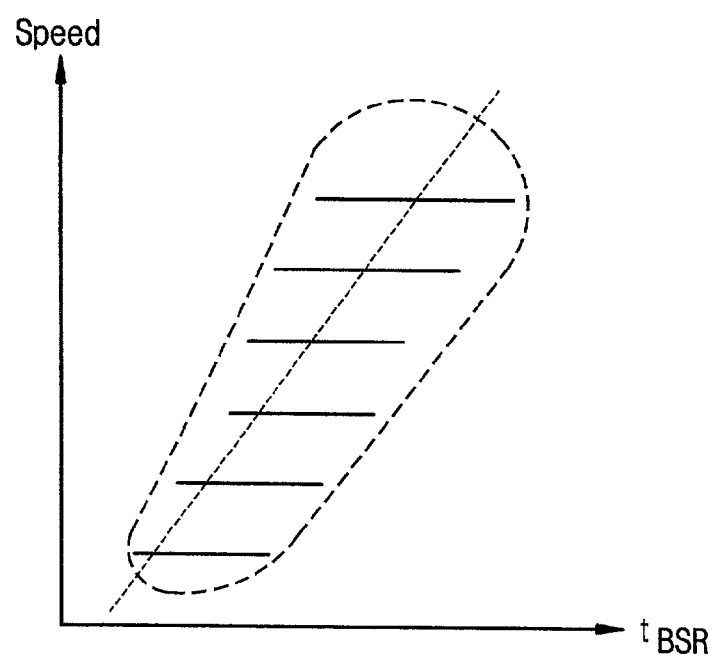
Figure 4:
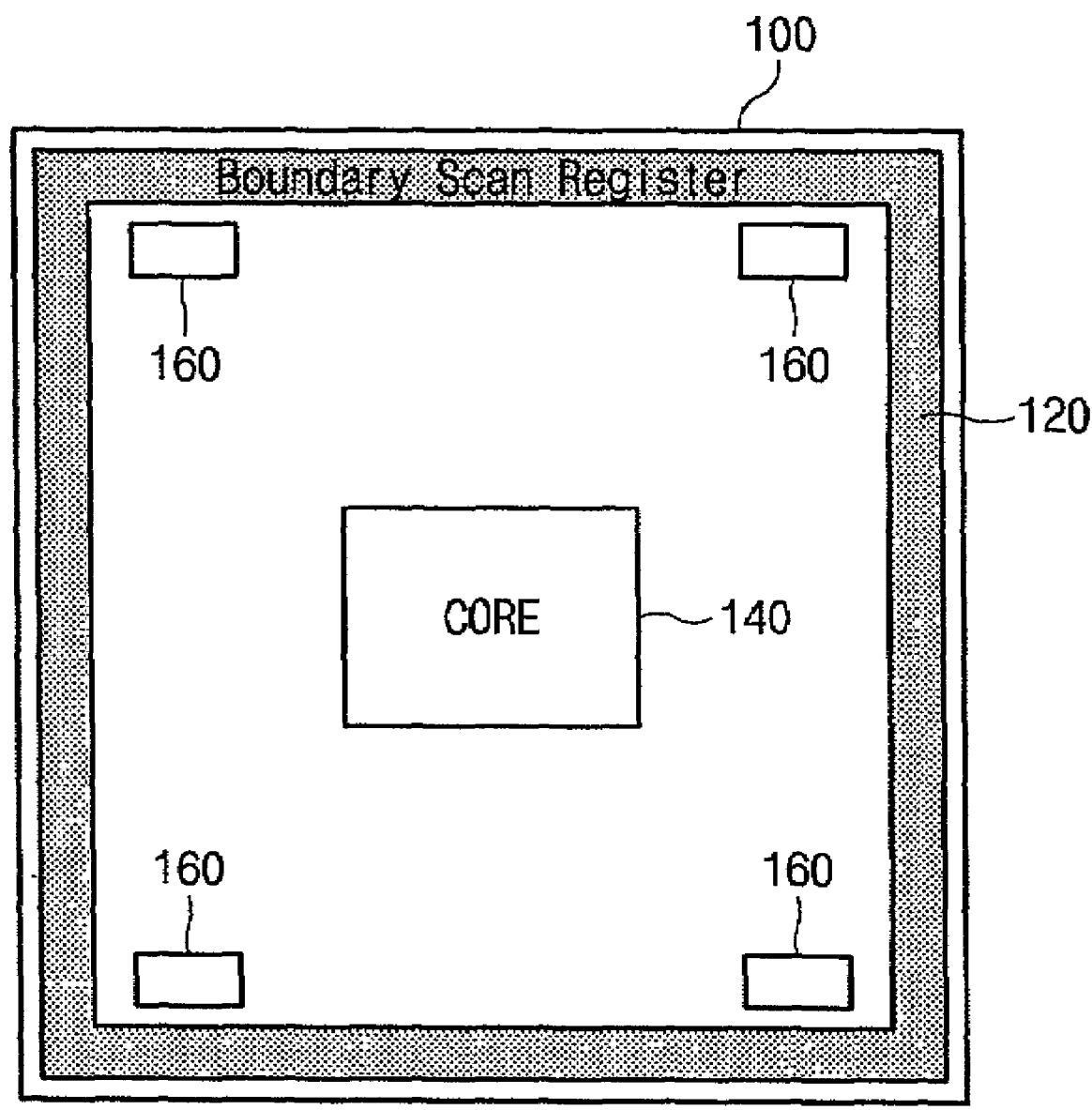
FIG. 4 is a block diagram illustrating a schematic arrangement of a semiconductor integrated circuit with local monitor circuits according to the present invention.

FIG. 4 illustrates an arrangement on a semiconductor integrated circuit 100 according to the invention, including a boundary scan register 120, local monitor circuits 160 and a core circuit 140. The boundary scan register circuit 120 is similar to one defined by the IEEE 1149.1 standard, which is composed of boundary scan cells serially connected to each other. The boundary scan register 120 provides a signal delay time reflecting overall on-chip process variations in peripheral circuits of the semiconductor integrated circuit 100. As described above, a bypass register, a command register, and a TAP controller, etc, in addition to the boundary scan register 120 are provided to the boundary scan testing circuit. Each boundary scan cell may have the same circuit architecture as that shown in FIG. 2. Otherwise, it is possible for the scan cell to use other circuit architectures.

The core circuit 140 is operable during a normal mode of operation of the semiconductor integrated circuit 100. During normal operation mode, the core circuit 140 is connected directly to the input/output pins to conduct data access. Each local monitor circuit 160 is independently arranged at a particular location on a peripheral region of the semiconductor integrated circuit 100 in order to measure a signal delay time according to on-chip process variation thereat. Each local monitor circuit 160 is connected between dummy pads, between the dummy pad and input/output pad, or between the input/output pads, and includes circuit elements that are correlated with system speed. Description of this feature is hereinafter described in detail.

The semiconductor integrated circuit 100 according to a preferred embodiment of the invention includes a structure suitable for evaluating overall and local signal delays. The overall signal delay measuring structure includes the boundary scan register 120 for providing a signal delay time reflecting overall variation for on-chip process in peripheral circuit regions of the semiconductor integrated circuit. The local signal delay measuring structure includes a plurality of local monitor circuits 160 each providing a signal delay time that reflects on-chip process variations at its location. Thus, an operation speed of the semiconductor integrated circuit will be predicted by using a database containing correlation values between the signal delay times measured by the respective local monitor circuits 160 and measured by the boundary scan register 120.

Preferred embodiments of the local monitor circuit 160 shown in FIG. 4, 160a through 160d, are illustrated in FIGS. 5A through 5D, respectively.

Figure 5A:
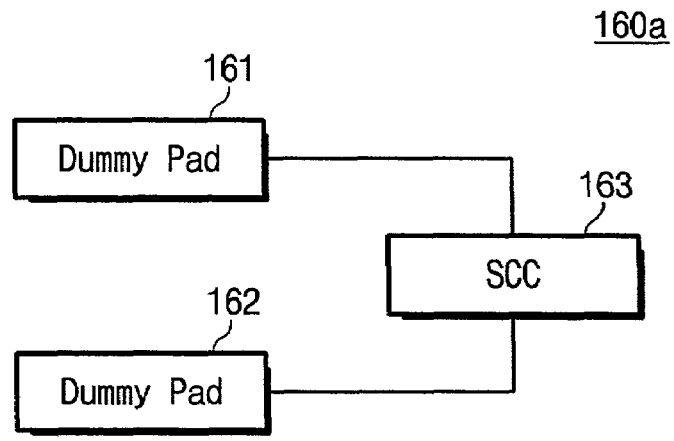
FIGS. 5A through 5D are block diagrams illustrating embodiments of the local monitor circuits shown in FIG. 4, in accordance with the present invention.
Figure 5B:
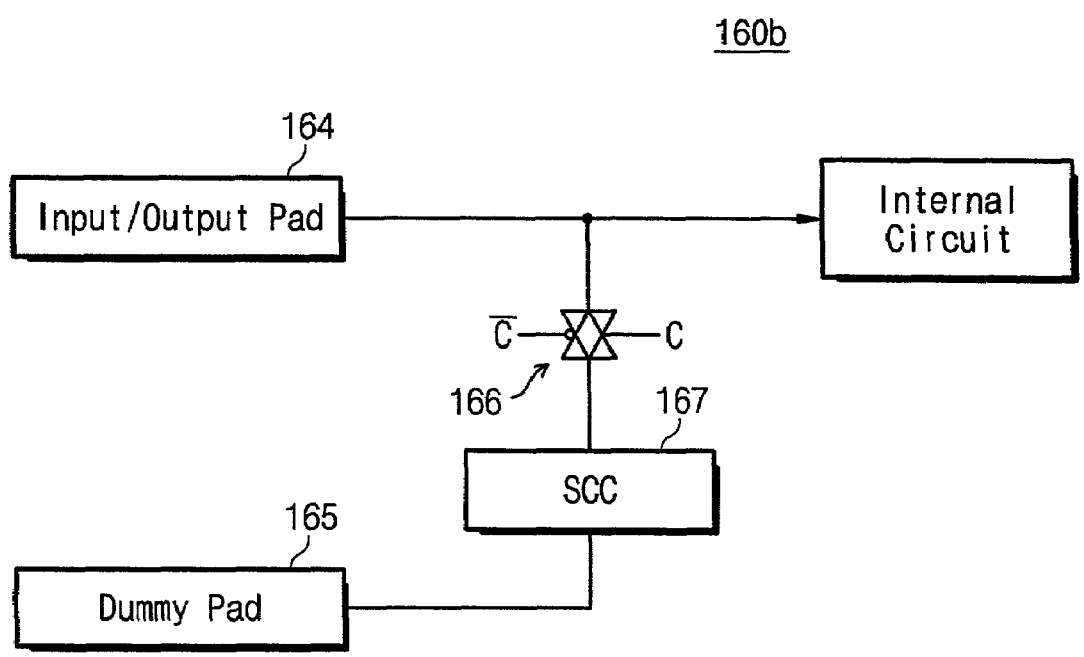
Figure 5C:
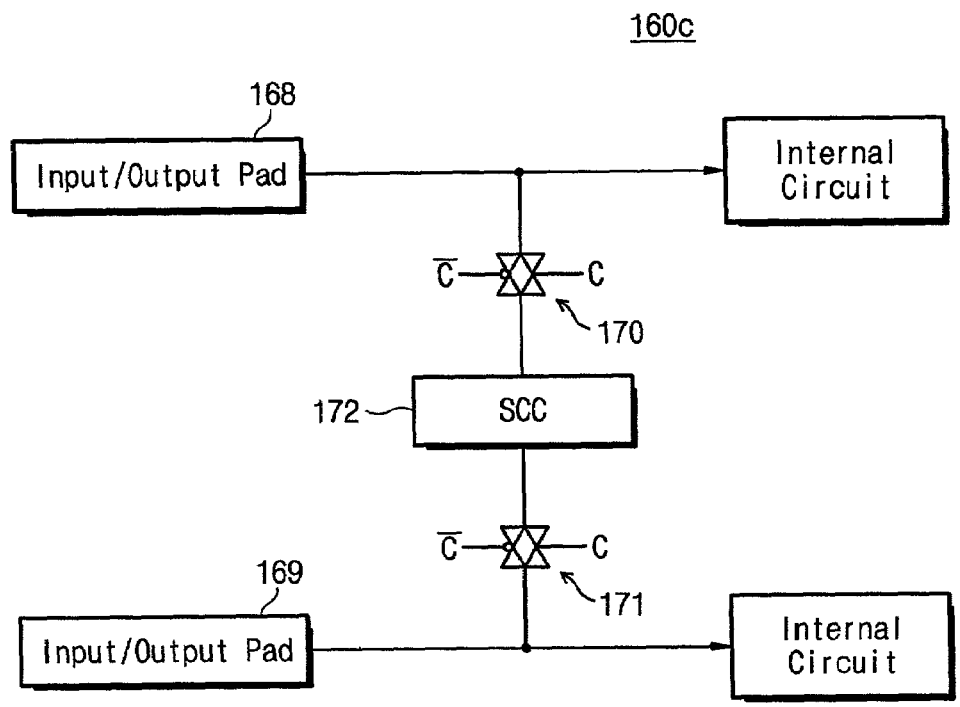
Figure 5D:
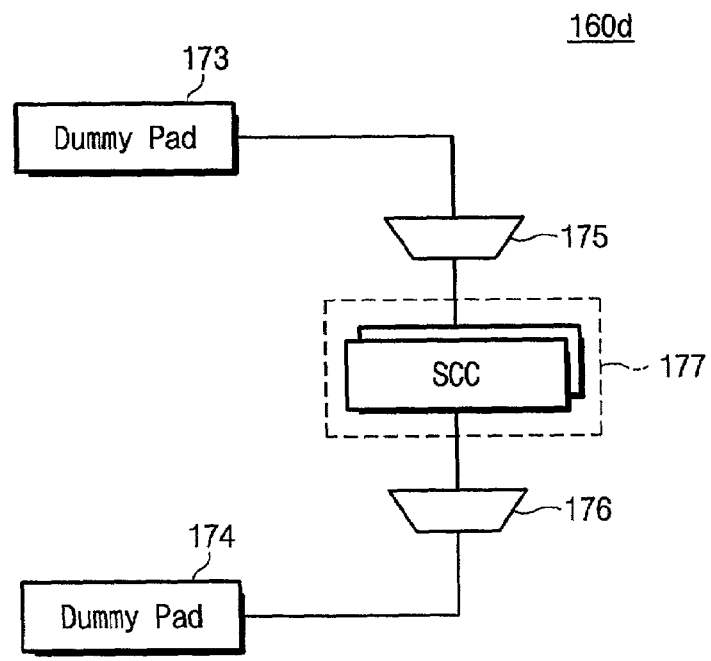
Figure 6A:
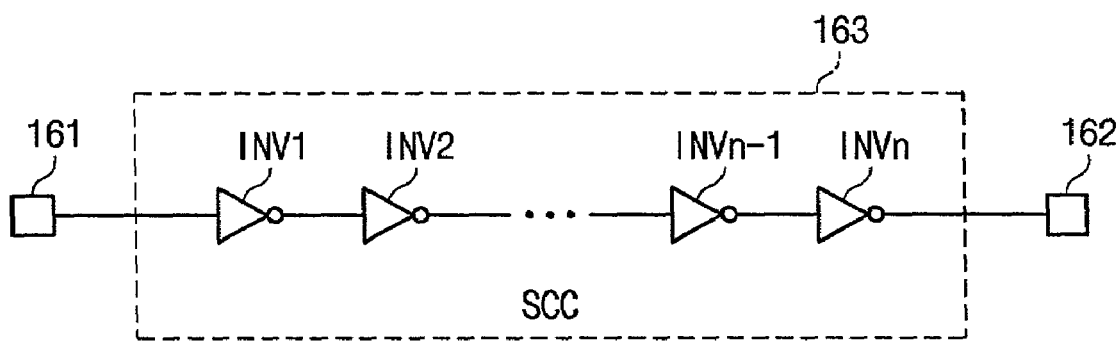
FIGS. 6A through 6D are circuit diagrams illustrating embodiments of the speed correlation circuit shown in FIG. 5A, 5B, 5C, or 5D, in accordance with the present invention.

As shown in FIG. 5A, the local monitor circuit 160a includes a speed correlation circuit (SCC) 163 connected between dummy pads 161 and 162. The dummy pads 161 and 162 are not electrically connected to input/output pins of the semiconductor integrated circuit. The speed correlation circuit 163 is constructed of circuit elements which are operable to determine, and correlate with, the circuit speed, and are serially connected between the dummy pads 161 and 162. An example of the component having correlation with the speed is, for example, an inverter formed of PMOS and NMOS transistors. The speed correlation circuit 163 having inverters is shown in FIG. 6A. The inverters INV1-INVn, as shown in FIG. 6A, are serially connected between the dummy pads 161 and 162.

Figure 6B:
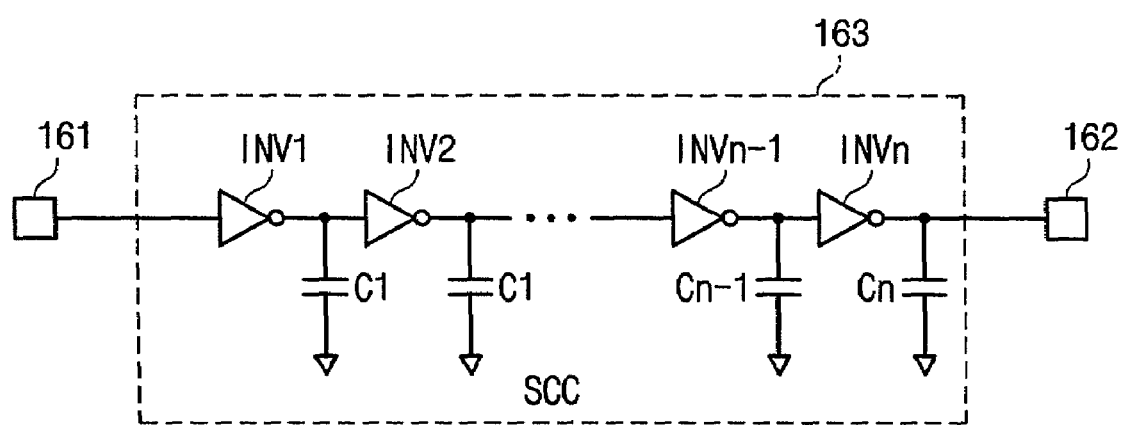
Figure 6C:
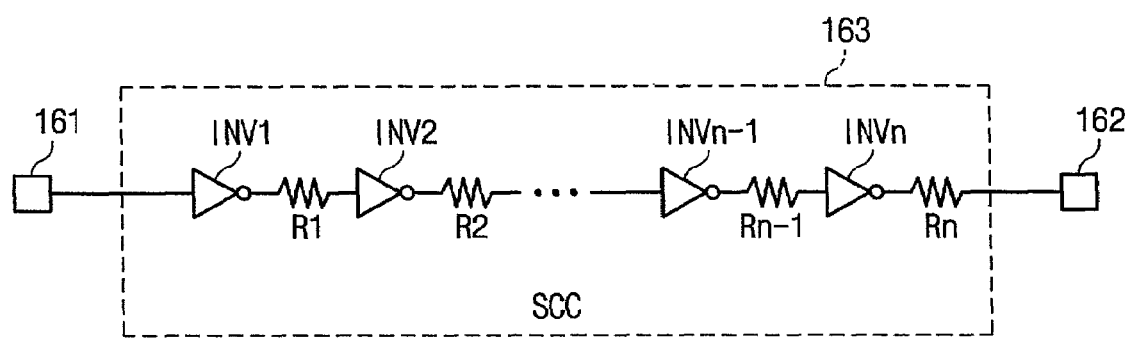
Figure 6D:
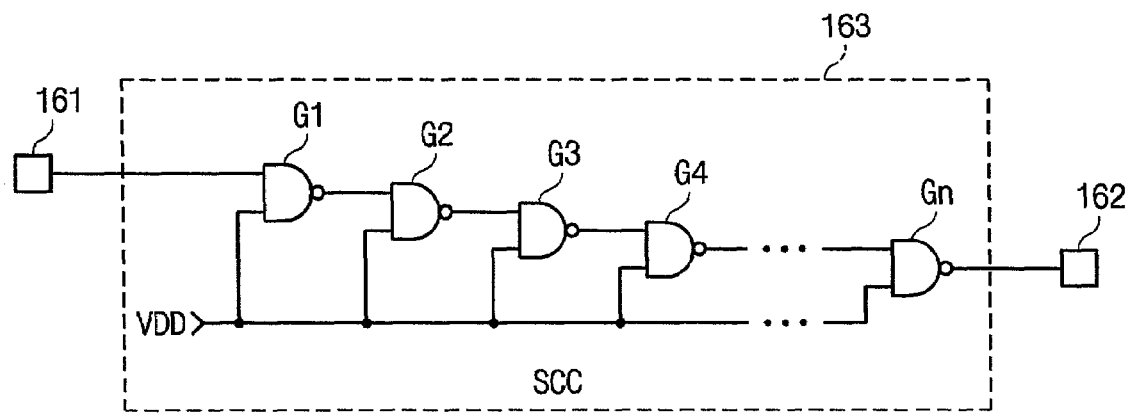

Various modifications to the speed correlation circuit 163 shown in FIG. 6A can be conceived. For instance, the speed correlation circuit 163 may be implemented with capacitors C1~Cn and inverters INV1-INVn as shown in FIG. 6B. Or, the speed correlation circuit 163 may alternatively be embodied with resistors R1~Rn and inverters INV1~INVn as shown in FIG. 6C. Otherwise, the speed correlation circuit 163 may be implemented by NAND gates G1~Gn as shown in FIG. 6D.

Returning to FIG. 5A, local monitor circuit 160a is associated with, and connected between, the dummy pads 161 and 162. Each local monitor circuit 160 can alternatively be constructed with the combination of dummy pads that are substantially not used and input/output pads normally connected to input/output pins. The dummy pads are not electrically connected to the input/output pins. For example, referring to FIG. 5B, the local monitor circuit 160b is formed of an input/output pad 164, a dummy pad 165, a transmission gate 166 and a speed correlation circuit 167. The input/output pad 164 is connected to an internal circuit. The transmission gate 166 is turned on while operating in a test mode and turned off while operating in a normal mode, by a control signal C. In the test operation mode, a signal applied to the input/output pad 164 is transferred to the dummy pad 165 through the transmission gate 166 and the speed correlation circuit 167.

The local monitor circuit 160 also may be implemented using the active input/output pads. For example, referring to FIG. 5C, the local monitor circuit 160c includes input/output pads 168 and 169, transmission gates 170 and 171, and a speed correlation circuit 172. The input/output pads 168 and 169 are connected to corresponding internal circuits. The transmission gates 170 and 171 are turned on during test mode and turned off during normal mode, by the control signal C. In the test mode, a signal applied to the input/output pad 168 is transferred to the input/output pad 169 through the transmission gate 170, the speed correlation circuit 172, and the transmission gate 171.

The local monitor circuit 160 may alternatively be implemented using a plurality of speed correlation circuits. For example, referring to FIG. 5D, the local monitor circuit 160d is formed of dummy or input/output pads 173 and 174, a first switch 175, a speed correlation circuit SCC block arranged in parallel 177, and a second switch 176. A signal applied to the pad 173 is applied to the speed correlation circuit SCC selected by the first switch 175 and an output signal of the selected speed correlation circuit SCC is sent to the pad 174 by the second switch 176.

It should be noted that the local monitor circuits 160 shown in FIG. 5A to 5D as various configurations are provided for measuring the signal delay time according to on-chip process variation in their respective locations spaced apart from the boundary scan register 120, as described above.

The local monitor circuit according to the invention can be classified into two types: one is vertical; the other is horizontal, in accordance with the direction of extension of the channel length of the MOS transistors thereof. A reason of classifying the local monitor circuit into a vertical type and a horizontal type arises from the fact that the process variations are dependent on a direction along which the channel length is settled. Namely, the extending direction of the channel length is an important one of parameters that determine the rates of the on-chip variations and thereby affect the signal delay time over the semiconductor integrated circuit.

Figure 7A:
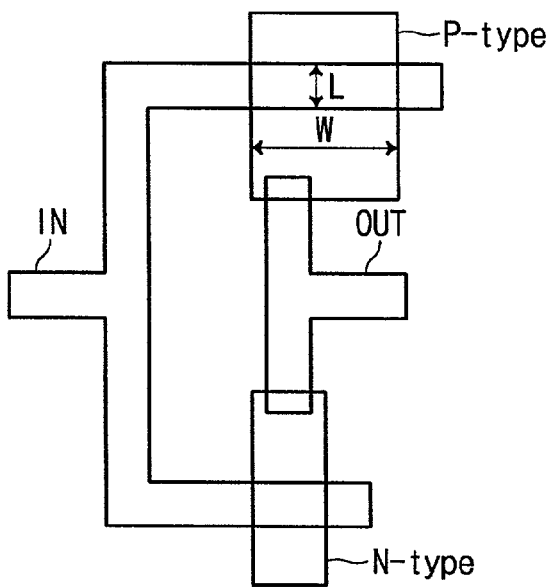
FIGS. 7A through 7C are schematic diagrams showing available layout patterns of an inverter employed in the local monitor circuit, in accordance with the present invention.
Figure 7B:
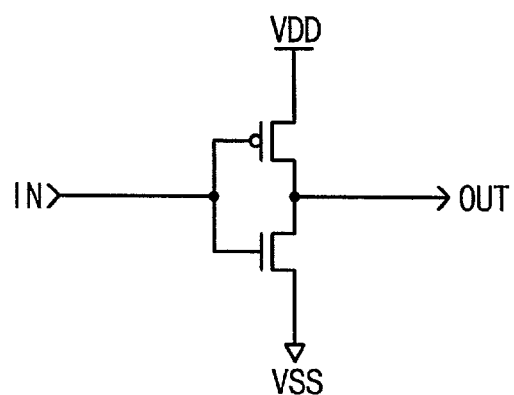
Figure 7C:
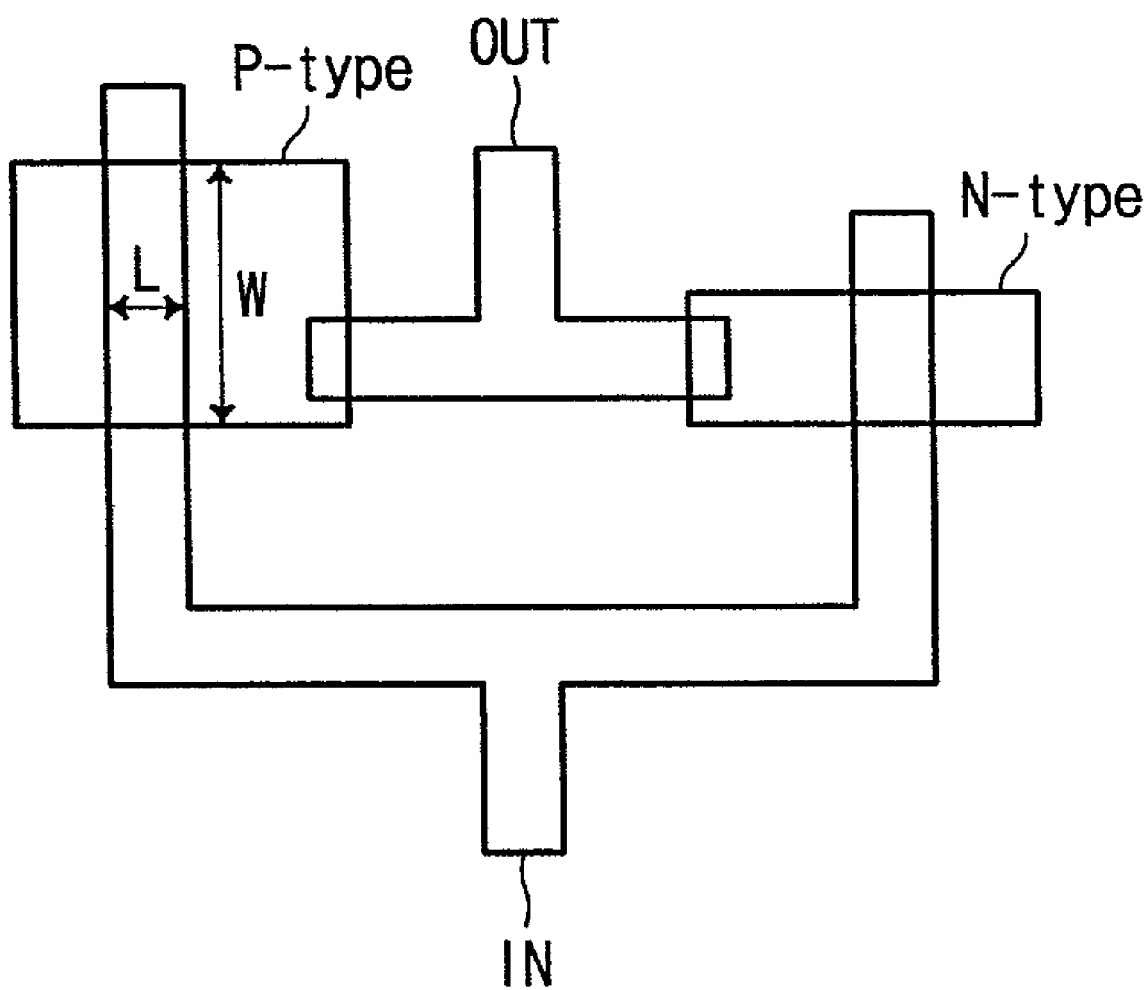

FIGS. 7A through 7B illustrate layout patterns of a CMOS inverter formed of PMOS and NMOS transistors. An inverter in the vertical monitor circuit, referring to FIG. 7A, is formed of transistors whose directions of channel length L extend in the vertical direction. Accordingly, an inverter in the horizontal monitor circuit is formed of transistors whose directions of channel length L extend in the horizontal direction. The local monitor circuit with the layout pattern shown in FIG. 7A is defined as the vertical type monitor circuit and the local monitor circuit with the layout pattern shown in FIG. 7C is defined as the horizontal type monitor circuit. The layouts of FIGS. 7A and 7C are represented by the schematic diagram of the inverter shown in FIG. 7B.

Figure 8A:
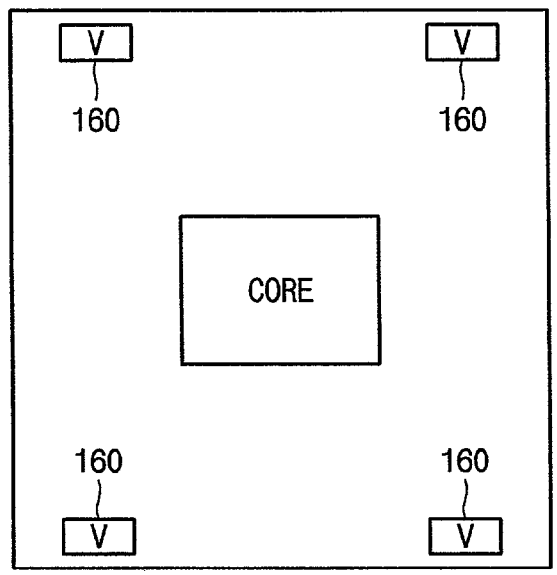
FIGS. 8A through 8D are schematic diagrams illustrating available features of arrangement with the local monitor circuits in a semiconductor integrated circuit, in accordance with the present invention.
Figure 8B:
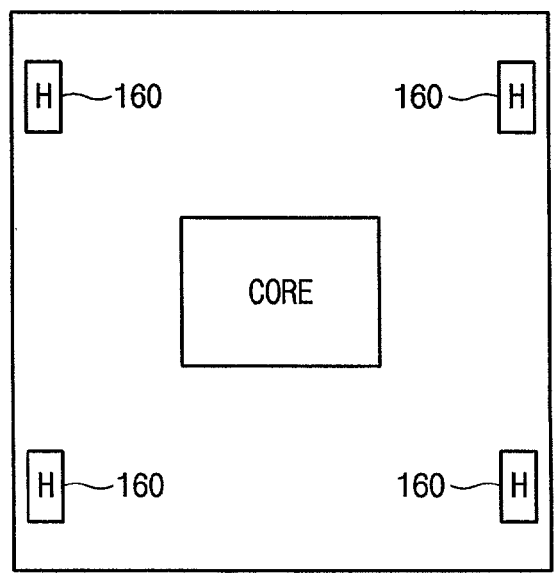
Figure 8C:
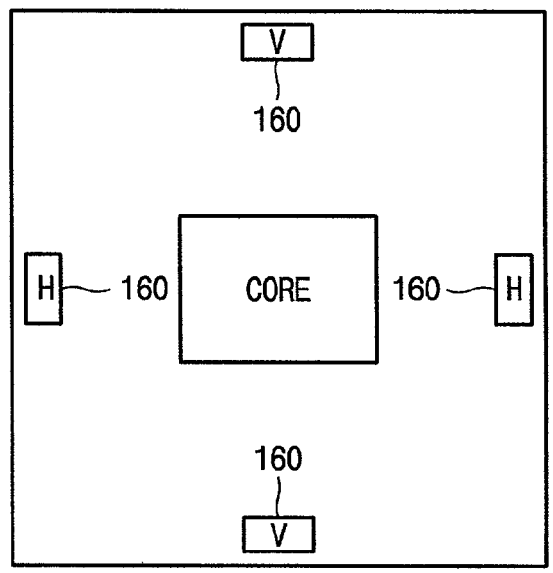
Figure 8D:
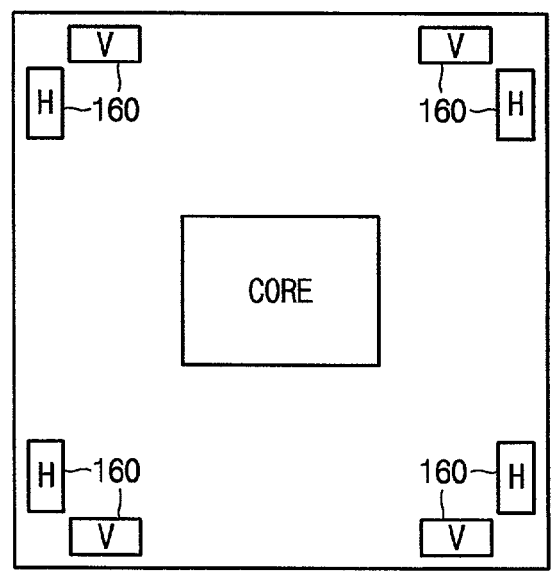

In arranging the local monitor circuits on a semiconductor integrated circuit, with the vertical and horizontal types, there are various configurations as shown in FIGS. 8A through 8D. For instance, as shown in FIG. 8A or 8B, the local monitor circuits 160 are composed with the vertical type monitor circuits V or the horizontal type monitor circuits H. On the other hand, as shown in FIG. 8C and 8D, the local monitor circuits 160 include both vertical and horizontal monitor circuits. It is apparent that the layout structure of the local monitor circuits according to the invention may be modified and changed variously.

The semiconductor integrated circuit according to preferred embodiments of the invention have advantageous effects as follows:

First, the semiconductor integrated circuit of the invention offers two types of signal delay measuring structures, i.e., the overall signal delay measuring structure and the local signal delay measuring structure. The overall signal delay measuring structure includes the boundary scan register 120 in order to provide the signal delay time reflecting overall on-chip process variations in peripheral circuit regions of the semiconductor integrated circuit. The local signal delay measuring structure includes a plurality of local monitor circuits 160 in order to provide the signal delay times reflecting on-chip process variations at their respective locations.

The operation speed of the semiconductor integrated circuit can be predicted by correlating between signal delay times from the local monitor circuits and a signal delay time from the boundary scan register, for example by storing the data in a database and computing the correlation results.

Since packaging procedures can be shortened because the erroneous operating speed prediction arising from only using the boundary scan register, as common in the prior art, is prevented therefrom, the overall manufacturing cost is reduced and packaging cost is lowered.

In addition, test time can be reduced because the local monitor circuit according to the invention employs dummy pads or input/output pad, rather than the manual method of directly measuring the operation speed at a plurality of points on the integrated circuit by using test equipment following manufacturing. The reduction of test time means that the number of integrated circuit chips that can be tested in a given time period increases. Moreover, the present invention contributes to the process stability, as the signal delay time to on-chip process variation can be reproduced in every production process.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor integrated circuit having a plurality of input/output pins, comprising:
    means for providing a first signal path successively formed along a peripheral circuit region of the semiconductor integrated circuit to measure a peripheral signal delay time as a function of variation in circuit fabrication in the peripheral circuit region; and
    means for providing multiple second signal paths individually formed at multiple corresponding local circuit regions of the semiconductor integrated circuit to measure local signal delay times as a function of variation in circuit fabrication in the local circuit regions, wherein the multiple local circuit regions are spaced apart from the peripheral circuit region, and wherein the first signal path is a different signal path than the second signal paths.

2. The semiconductor integrated circuit according to claim 1, wherein the means for providing the first signal path includes a boundary scan register having boundary scan cells respectively connected to the input/output pins.

3. The semiconductor integrated circuit according to claim 2, wherein the boundary scan cells have the same circuit pattern and are serially connected to each other to provide the first signal path.

4. The semiconductor integrated circuit according to claim 1, wherein the means for providing the multiple second signal paths includes a plurality of local monitor circuits respectively arranged in the multiple corresponding local circuit regions.

5. The semiconductor integrated circuit according to claim 4, wherein each of the local monitor circuits includes:
    first and second pads; and
    a speed correlation circuit connected between the first and second pads.

6. The semiconductor integrated circuit according to claim 5, wherein the speed correlation circuit includes circuit elements operable in correlation with a speed, and is serially connected between the first and second pads.

7. The semiconductor integrated circuit according to claim 6, wherein the circuit elements include inverters serially connected between the first and second pads.

8. The semiconductor integrated circuit according to claim 6, wherein the speed correlation circuit includes either a vertical directional type circuit or a horizontal directional type circuit in accordance with a direction of extension of channel length.

9. The semiconductor integrated circuit according to claim 5, wherein the first and second pads include either a dummy pad or an input/output pad, respectively.

10. The semiconductor integrated circuit according to claim 5, wherein the first and second pads include a dummy pad and an input/output pad, respectively.

11. The semiconductor integrated circuit according to claim 5, wherein each of the local monitor circuits includes a transmission gate, wherein the transmission gate is in a first state while operating in a test mode and in a second state while operating in a normal mode, and wherein the transmission gate is controlled by a control signal.

12. The semiconductor integrated circuit according to claim 5, wherein the first and second pads are dummy pads.

13. A semiconductor integrated circuit having a plurality of input/output pins, comprising:
    a boundary scan register including a chain of boundary scan cells respectively connected to input/output pins to measure a peripheral signal delay time corresponding to overall on-chip process variations of the semiconductor integrated circuit, the boundary scan register having a first signal path; and
    a plurality of local monitor circuits individually arranged at multiple corresponding local circuit regions on the semiconductor integrated circuit to each measure local signal delay times corresponding to location-specific on-chip process variations of the local circuit regions at multiple locations of the semiconductor integrated circuit, the local monitor circuits having second signal paths, wherein the local monitor circuits are spaced apart from the boundary scan register, and wherein the first signal path is a different signal path than the second signal paths.

14. The semiconductor integrated circuit according to claim 13, wherein each of the local monitor circuits includes a speed correlation circuit connected between first and second pads.

15. The semiconductor integrated circuit according to claim 14, wherein the speed correlation circuit includes circuit elements operable in correlation with a speed and is serially connected between the first and second pads.

16. The semiconductor integrated circuit according to claim 15, wherein the circuit elements include inverters serially connected between the first and second pads.

17. The semiconductor integrated circuit according to claim 15, wherein the speed correlation circuit includes either a vertical directional type circuit or a horizontal directional type circuit in accordance with a direction of extension of channel length.

18. The semiconductor integrated circuit according to claim 14, wherein the first and second pads include either a dummy pad or an input/output pad.

19. The semiconductor integrated circuit according to claim 14, wherein the first and second pads include a dummy pad and an input/output pad, respectively.

20. The semiconductor integrated circuit according to claim 14, wherein the first and second pads are dummy pads.

21. The semiconductor integrated circuit according to claim 1, wherein the multiple local circuit regions are spaced apart from each other.

22. The semiconductor integrated circuit according to claim 13, wherein the local monitor circuits are spaced apart from each other.

23. A semiconductor integrated circuit having a plurality of input/output pins, comprising:
    means for providing a first signal path successively formed along a peripheral circuit region of the semiconductor integrated circuit to measure a peripheral signal delay time of the peripheral circuit region; and means for providing multiple second signal paths individually formed at multiple corresponding local circuit regions of the semiconductor integrated circuit to measure local signal delay times at the local circuit regions, wherein the multiple local circuit regions are spaced apart from the peripheral circuit region, wherein the first signal path is a different signal path than the second signal paths, the means for providing multiple second signal paths further including a plurality of local monitor circuits respectively arranged in the multiple corresponding local circuit regions, and wherein each of the local monitor circuits includes a speed correlation circuit connected between first and second pads, the speed correlation circuit including circuit elements operable in correlation with a speed, and the speed correlation circuit including either a vertical directional type circuit or a horizontal directional type circuit in accordance with a direction of extension of channel length.

24. A semiconductor integrated circuit having a plurality of input/output pins, comprising:

a boundary scan register including a chain of boundary scan cells respectively connected to input/output pins to measure a peripheral signal delay time corresponding to on-chip process variations of the semiconductor integrated circuit, the boundary scan register having a first signal path; and a plurality of local monitor circuits individually arranged at multiple corresponding local circuit regions on the semiconductor integrated circuit to measure local signal delay times corresponding to on-chip process variations of the local circuit regions, the local monitor circuits having second signal paths, wherein the local monitor circuits are spaced apart from the boundary scan register, wherein the first signal path is a different signal path than the second signal paths, wherein each of the local monitor circuits includes a speed correlation circuit connected between first and second pads, wherein the speed correlation circuit includes circuit elements operable in correlation with a speed and is serially connected between the first and second pads, and wherein the speed correlation circuit includes either a vertical directional type circuit or a horizontal directional type circuit in accordance with a direction of extension of channel length.

* * * * *